United States Patent
Bolli

(10) Patent No.: US 7,287,317 B2
(45) Date of Patent: Oct. 30, 2007

(54) APPARATUS FOR MOUNTING SEMICONDUCTOR CHIPS

(75) Inventor: Beat Bolli, Hünenberg (CH)

(73) Assignee: Unaxis International Trading Ltd., Cham (CH)

( * ) Notice: Subject to any disclaimer, the term of this patent is extended or adjusted under 35 U.S.C. 154(b) by 386 days.

(21) Appl. No.: 10/985,424

(22) Filed: Nov. 10, 2004

(65) Prior Publication Data
US 2005/0097729 A1     May 12, 2005

(30) Foreign Application Priority Data
Nov. 11, 2003  (CH) .................................. 1952/03

(51) Int. Cl.
*B23P 19/00* (2006.01)
*B23K 31/00* (2006.01)

(52) U.S. Cl. .......................... 29/739; 29/740; 29/744; 29/783; 29/786; 228/180.22

(58) Field of Classification Search ................ 29/742, 29/740, 760, 739, 709, 832, 744, 783, 786, 29/430, 431, 719, 25.01; 228/180.22, 102, 228/212, 180.21; 356/237.5, 394
See application file for complete search history.

(56) References Cited

U.S. PATENT DOCUMENTS

| | | | |
|---|---|---|---|
| 4,202,402 A | * | 5/1980 | Rohrig ........................ 164/263 |
| 5,163,222 A | | 11/1992 | Imlig et al. |
| 5,351,876 A | * | 10/1994 | Belcher et al. ........ 228/180.22 |
| 5,579,985 A | * | 12/1996 | Ichikawa ..................... 228/102 |
| 5,956,134 A | * | 9/1999 | Roy et al. ................. 356/237.5 |
| 6,141,599 A | * | 10/2000 | Mochida et al. ............ 700/114 |
| 6,533,531 B1 | | 3/2003 | Nguyen et al. |
| 6,578,703 B2 | | 6/2003 | Humphrey et al. |

FOREIGN PATENT DOCUMENTS

| | | |
|---|---|---|
| CH | 679 878 | 4/1992 |
| CH | 689 188 | 11/1998 |
| EP | 330 831 | 9/1989 |

\* cited by examiner

*Primary Examiner*—A. Dexter Tugbang
*Assistant Examiner*—Tai Van Nguyen
(74) *Attorney, Agent, or Firm*—Thelen Reid Brown Raysman & Steiner LLP; David B. Ritchie

(57) ABSTRACT

An apparatus for mounting semiconductor chips with a transport device that transports the substrates in cycles to a bonding station where a semiconductor chip is deposited comprises a receiving table with a support surface on which the substrates are presented one after the other for transport by the transport device as well as a pusher device with a drive system and a slide for alignment of the substrate on an end stop. In accordance with the invention, the drive system and the slide comprise a first magnet and a second magnet that attract each other, ie, they are magnetically coupled. The drive system is arranged underneath the support surface and moves its magnet back and forth whereby the magnet of the slide is moved with it. One of the two magnets can also be a ferromagnetic body. The drive system is controlled by software.

1 Claim, 2 Drawing Sheets

APPARATUS FOR MOUNTING SEMICONDUCTOR CHIPS

PRIORITY CLAIM

Applicants hereby claim foreign priority under 35 U.S.C § 119 from Swiss Application No. 1952/03 filed Nov. 11, 2003, the disclosure of which is herein incorporated by reference.

FIELD OF THE INVENTION

The invention concerns an apparatus for mounting semiconductor chips.

BACKGROUND OF THE INVENTION

In many applications, semiconductor chips are mounted onto a metallic substrate, a so-called leadframe. To do so, the leadframes are presented in magazines or on a stack from where they are removed by a robot and fed to the transport device of an automatic assembly machine, a so-called Die Bonder, that transports the leadframes one after the other to a dispensing station where adhesive or solder is applied and to a bonding station where the semiconductor chip is deposited.

The transport device consists for example of a system of fixed and moveable clamps that hold the leadframe on a longitudinal edge. This longitudinal edge of the leadframe rests on a guide rail. Such a transport device is known from U.S. Pat. No. 5,163,222 or CH 689 188.

The robot has suction grippers with which one leadframe after the other is removed from the stack and placed onto a support surface of the transport device. A pusher device pushes the leadframe against the guide rail of the transport device by means of a slide so that one of its longitudinal edges rests against the guide rail. The leadframe is now aligned so that it can be transported by the clamps to the dispensing station and then to the bonding station. The support surface has grooves running at right angles to the transport direction in order to be able to connect the slide to a drive arranged underneath the support surface. This solution has two significant disadvantages. One is that very often the fingers of a leadframe get caught in one of these grooves whereby the leadframe is damaged and unusable. The other is that each time the leadframe type is changed, the travel distance, ie, the distance, that has to be covered by the slide has to be reset by hand corresponding to the width of the new leadframe.

SUMMARY OF THE INVENTION

The object of the invention is to develop a pusher device without these named disadvantages.

An apparatus for mounting semiconductor chips with a transport device that transports the substrates in cycles to a dispensing or soldering station where an amount of adhesive or solder is applied and to a bonding station where a semiconductor chip is deposited, comprises a receiving table with a support surface on which the substrates are presented one after the other for transport with the transport device, as well as a pusher device with an electromechanical drive system and with a slide for aligning the substrates on an end stop. In accordance with the invention, the drive system and the slide each comprise at least one magnet that attract each other, ie, that are magnetically coupled. The drive system is arranged underneath the support surface and moves its magnets back and forth whereby the magnet of the slide is also moved. One of the two magnets can also be replaced with a ferromagnetic body as a magnetic coupling also exists between a magnet and a body made of ferromagnetic material. The support surface of the receiving table for the substrates is a structureless surface, ie, a surface that is essentially free of grooves, slits and things of that kind. The electromechanical drive system is programmable, ie, the position of the magnet can be set by software. The position to be approached by the slide can therefore be set via software corresponding to the width of the substrate. The travel distance of the magnet of the drive system is programmed so that the magnet of the drive system remains within the force field of the magnet of the slide even when the slide comes to a stop on the substrate as soon as the substrate hits and aligns with the end stop.

The apparatus for mounting semiconductor chips on a substrate comprises a transport device that transports the substrate in cycles to a bonding station where a semiconductor chip is deposited, a receiving table with a support surface on which the substrates are presented one after the other for transport with the transport device, the support surface formed as a structureless surface, and a pusher device having a slide for aligning the substrate on an end stop and a drive system for moving the slide, the drive system and the slide magnetically coupled by means of at least a first magnet and a second magnet or a ferromagnetic body, the drive system comprising an electric motor, and a control apparatus, e.g. a computer, controlling the electric motor, thus enabling a starting position and a travel distance of the drive system to be set by software running on the control apparatus.

For applications with which the substrates are already provided with adhesive, e.g. in the form of a tape, the dispensing station of the mounting apparatus can be omitted.

In the following, an embodiment of the invention is explained in more detail based on the drawing.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF A PREFERRED EMBODIMENT

Figure 1:
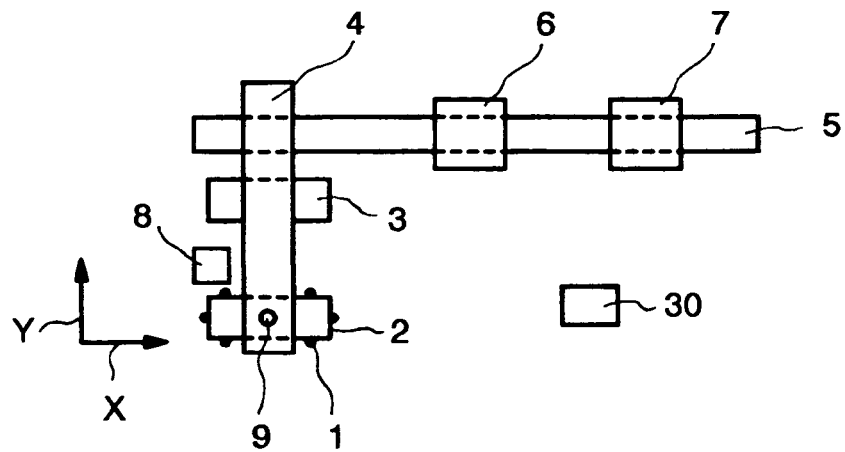
FIG. 1 shows a plan view of an apparatus for mounting semiconductor chips.

FIG. 1 shows schematically a plan view of an apparatus for mounting semiconductor chips, a so-called Die Bonder, as far as is necessary for the understanding of the invention. The Die Bonder comprises a loading station 1 where substrates 2 to be equipped with semiconductor chips are presented. In the example, the substrates 2 are stacked one above the other. In addition, the Die Bonder comprises a trash bin 3, a robot 4 and a transport device 5, a dispensing or soldering station 6, a bonding station 7 as well as a sensor 8 for determining the number of substrates 2 removed simultaneously from the loading station 1. The robot 4 has a gripper 9 that can be moved back and forth in a y direction that removes one substrate 2 after the other from the loading station 1, transports them in y direction past the sensor 8 and, depending on the signal from the sensor 8, either passes them on to the trash bin 3 or to the transport device 5. The transport device 5 transports the substrates 2 in cycles to the dispensing or soldering station 6 where an amount of adhesive or solder is applied and to the bonding station 7 where a semiconductor chip is deposited. The apparatus for mounting semiconductor chips is controlled by a control apparatus 30, e.g. a computer.

The substrates 2 can however also be presented in a magazine. In this case, the substrate 2 is pushed out of the magazine by means of a slide and passed on to the transport device 5.

Once the substrate 2 has been passed on to the transport device 5 it lies on a support surface of a receiving table. Before the substrate 2 can be transported further, it has to be aligned. The support surface is a structureless surface, ie, a flat surface that is essentially free of grooves, slits or openings.

Figure 2:
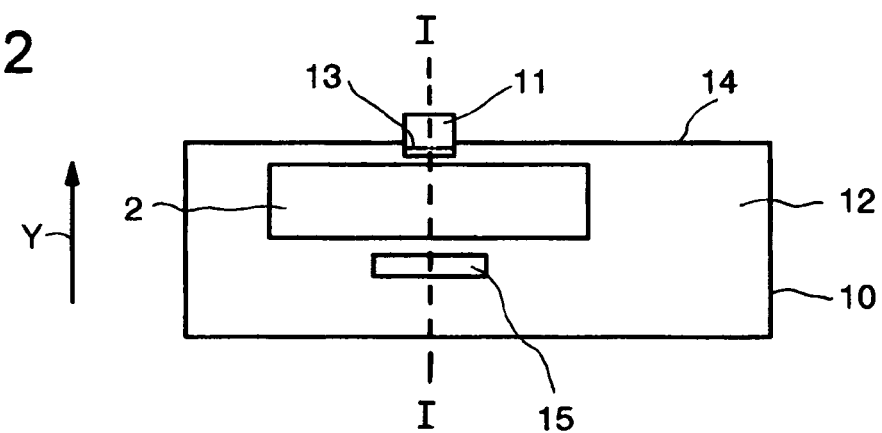
FIG. 2 shows a plan view of a receiving table.

FIG. 2 shows a plan view of the receiving table 10 and a fixed or moveable clamp 11 that belongs to the transport device 5. The clamp 11 has an end stop 13 (shown with a broken line) that protrudes above the level of the support surface 12 that serves the alignment of the substrates 2. A slide 15 moveable back and forth in y direction, ie, at right angles to the longitudinal side 14 of the receiving table 10 serves to push the substrates 2 placed for processing onto the support surface 12 against the end stop 13 and in doing so to align the substrate 2 parallel to the end stop 13. In accordance with the invention, the movement of the slide 15 is done by means of a drive system with which the drive and the slide 15 are magnetically coupled and the position to be approached by the drive is programmable.

Figure 3:
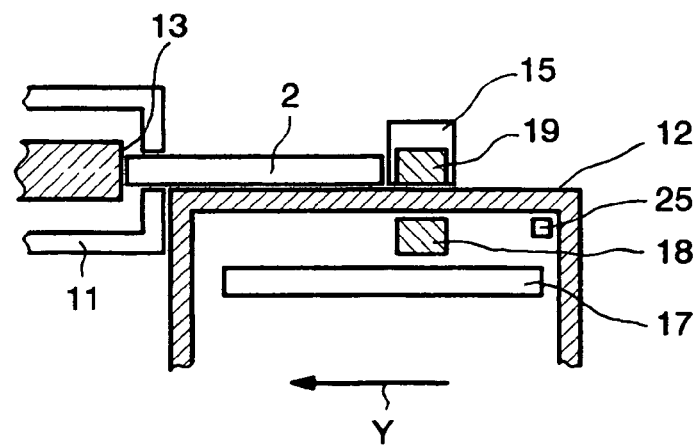
FIG. 3 shows a cross-section of the receiving table.
Figure 4:
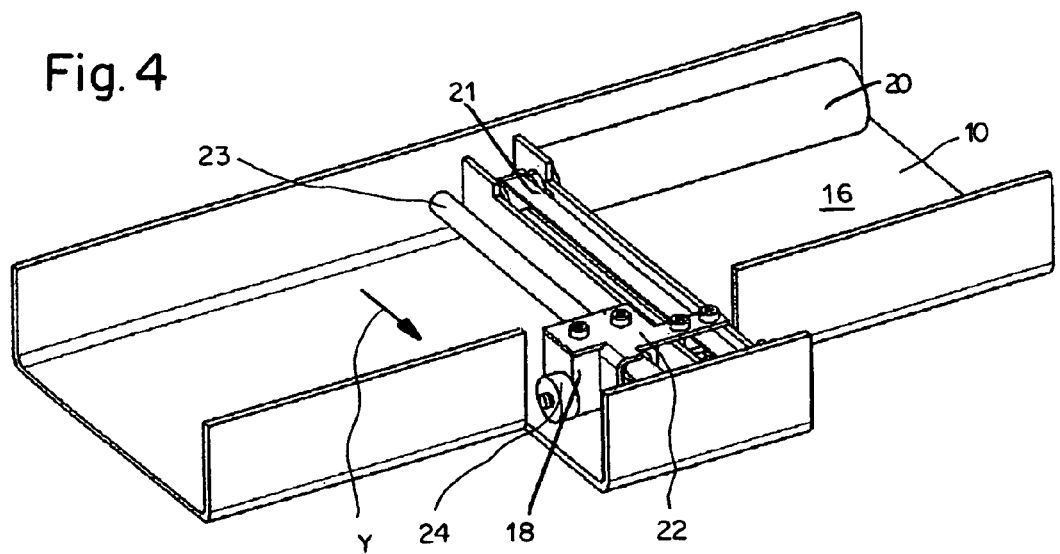
FIG. 4 shows a perspective view of the underneath of the receiving table.

FIG. 3 shows a cross-section of the receiving table 10 along the line 1-1 of FIG. 2. A magnet 18 that can be moved back and forth in y direction by means of an electromechanical drive system 17 is located on the underneath 16 of the receiving table 10. The slide 15 also contains a magnet 19 (FIG. 4). The poles of the two magnets 18 and 19 are aligned so that the two magnets 18 and 19 attract. When the drive system moves the magnet 18, then the magnet 19 is moved with it.

FIG. 4 shows a perspective view of the underneath 16 of the receiving table 10 with a preferred embodiment of the electromechanical drive system. The drive system comprises an electric motor 20, a toothed belt 21, a shuttle 22 and a guide rod 23 running in y direction for guiding the shuttle 22. The shuttle 22 is, on the one hand, attached to the toothed belt 21 and, on the other hand, supported on the underneath 16 of the receiving table 10 by means of a roller 24. The magnet 18 is attached to the side of the guide rod 23 on the shuttle 22 facing the roller 24. The torque exerted on the shuttle 22 by means of the attraction force of the two magnets 18 and 19 has the effect that the roller 24 rests on the underneath 16 of the receiving table 10. Instead of the toothed belt 21, a rubber band can also be used. The shuttle 22 can also bear on a linear guide that replaces the guide rod 23 and the roller 24. The electric motor 20 is for example a step motor.

Optionally, a sensor 25 (FIG. 3) is present for example in the form of a light barrier or an inductive sensor or a limit switch with which the absolute position of the shuttle 22 (FIG. 4) can be determined.

The apparatus for mounting semiconductor chips is controlled by the computer or control apparatus 30, respectively. As soon as the operator has entered the width of the substrate, the computer or control apparatus 30 calculates the respective starting position to be approached by the shuttle 22. The computer or control apparatus 30 also controls the electric motor 20.

In operation, the slide 15 is actuated as follows:

On initialising the Die Bonder, the electric motor 20 is switched on in order to move the shuttle 22 towards the sensor 25 and to determine the absolute position of the shuttle 22.

In production, at the start, the electric motor 20 is driven to move the shuttle 22 to a predetermined starting position. Thanks to the magnetic coupling, the slide 15 moves with the shuttle 22 to the starting position. The next substrate 2 is now placed onto the support surface 12 of the receiving table 10. The position of the shuttle 22 is predetermined in such a way that the substrate 2 finds its place between the end stop 13 and the slide 15, ie, that in no case the substrate 2 rests on the slide 15. Afterwards, the shuttle 22 is moved a predetermined distance $\Delta y$ (travel distance) in the direction towards the end stop 13. In doing so, the slide 15 carried with it pushes the substrate 2 towards the end stop 13 whereby the substrate 2 comes to rest on the end stop 13 and automatically aligns itself parallel to the end stop 13. In doing so, the slide 15 deflects relative to the slide 22 however its magnet 18 remains within the attraction range of the magnet 19 of the shuttle 22. As soon as the substrate 2 is aligned, it is gripped by the clamp 11 and the shuttle 22 is moved by the distance $\Delta y$ away from the end stop 13 back to the starting position. Again, the slide 15 moves with the shuttle 20 to the starting position.

The invention offers the following advantages:

The receiving table 10 can be manufactured from any non-magnetic material, for example from a piece of sheet metal without slits and openings.

When the motor 20 moves the shuttle 22 towards the end stop 13, then there is no danger that the slide 15 moved with it could squash the substrate 2 because the slide 15 automatically deflects as soon as the substrate 2 is aligned parallel to the end stop 13.

The starting position of the slide 15 and the travel distance $\Delta y$ can be adapted to the width of the substrate by means of software.

With a preferred embodiment, the slide 15 and the shuttle 22 each have two magnets offset at right angles to the y axis. This has the effect that the slide 15 automatically aligns itself parallel to the end stop 13. The distance $\Delta y$, that the shuttle 22 has to travel with the back and forth movement can then be kept very low.

As already mentioned in the brief description of the invention, one of the two magnets 18 or 19 can be replaced by a ferromagnetic body.

The geometrical shape of the slide 15 has no special significance because the alignment of the substrate 2 is completely defined by two points on the end stop 13 and one point on the slide 15. The slide 15 can therefore be square shaped as shown in FIG. 2. However it can also be spherical.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting semiconductor chips on a substrate, comprising
   - a transport device that transports the substrate in cycles to a bonding station where a semiconductor chip is deposited,
   - a receiving table with a support surface on which the substrates are presented one after the other for transport with the transport device, the support surface formed as a structureless surface, and
   - a pusher device having a slide for aligning the substrate on an end stop and a drive system for moving the slide, the drive system and the slide magnetically coupled by means of at least a first magnet and a second magnet or a ferromagnetic body, the drive system comprising an electric motor, and
   - a control apparatus controlling the electric motor, thus enabling a starting position and a travel distance of the drive system to be set by software running on the control apparatus.

* * * * *